(12) United States Patent
Otani

(10) Patent No.: US 11,018,303 B2
(45) Date of Patent: May 25, 2021

(54) CHARGE-TRANSPORTING VARNISH

(71) Applicant: NISSAN CHEMICAL INDUSTRIES, LTD., Tokyo (JP)

(72) Inventor: Naoki Otani, Funabashi (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 443 days.

(21) Appl. No.: 15/315,983

(22) PCT Filed: Jun. 2, 2015

(86) PCT No.: PCT/JP2015/065858
§ 371 (c)(1),
(2) Date: Dec. 2, 2016

(87) PCT Pub. No.: WO2015/186688
PCT Pub. Date: Dec. 10, 2015

(65) Prior Publication Data
US 2017/0104161 A1    Apr. 13, 2017

(30) Foreign Application Priority Data
Jun. 5, 2014 (JP) .............................. JP2014-116448
Feb. 3, 2015 (JP) .............................. JP2015-019251

(51) Int. Cl.
*H01B 1/00* (2006.01)
*H01L 51/00* (2006.01)
*C09D 5/24* (2006.01)
*H05B 33/10* (2006.01)
*H01L 51/50* (2006.01)
*C09D 7/45* (2018.01)
(Continued)

(52) U.S. Cl.
CPC ............ *H01L 51/0059* (2013.01); *C09D 5/24* (2013.01); *C09D 7/45* (2018.01); *H01B 1/124* (2013.01); *H01L 51/0035* (2013.01); *H01L 51/50* (2013.01); *H05B 33/10* (2013.01); *H01L 51/0003* (2013.01); *H01L 51/5088* (2013.01); *H01L 51/56* (2013.01)

(58) Field of Classification Search
CPC .......... H01B 1/00; H01B 1/121; H01B 1/124; H01B 1/20; H01L 51/50; H01L 51/5056; H05B 33/00; H05B 33/10
See application file for complete search history.

(56) References Cited

U.S. PATENT DOCUMENTS 6,650,047 B2* 11/2003 Aoki ................... H01L 27/3239
313/506
7,115,351 B2* 10/2006 Kishimoto .......... H01L 51/0013
430/199
2005/0263781 A1  12/2005 Hsu
(Continued)

FOREIGN PATENT DOCUMENTS

JP    2005-519440 A    6/2005
JP    2006-237083 A    9/2006
(Continued)

OTHER PUBLICATIONS

English language machine translation of JP 2013-222688 (pub Oct. 2013) (Year: 2013).*
(Continued)

*Primary Examiner* — Mark Kopec
(74) *Attorney, Agent, or Firm* — Birch, Stewart, Kolasch & Birch, LLP

(57) ABSTRACT

A charge-transporting thin film, which enables the achievement of an organic EL element having excellent durability in cases where the charge-transporting thin film is applied to a hole injection layer of the element, is obtained using a charge-transporting varnish that contains a charge-transporting substance, a nonionic fluorine-containing surfactant and an organic solvent, and wherein the nonionic fluorine-containing surfactant has, for example, a perfluoroalkenyl group-containing perfluorohydrocarbon structure represented by one of formulae (1)-(3) and an alkylene oxide structure.

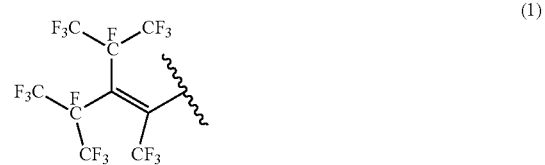

(1)

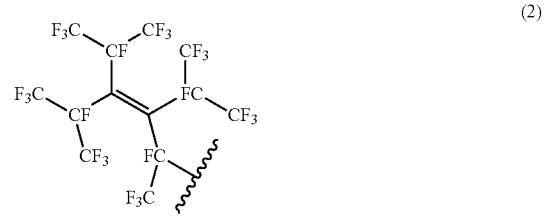

(2)

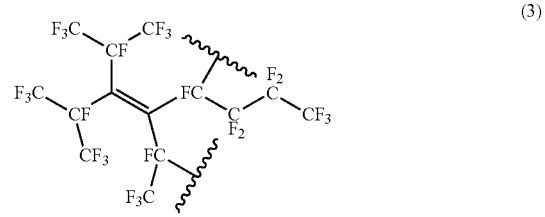

(3)

11 Claims, 1 Drawing Sheet

(51) Int. Cl.
  *H01B 1/12* (2006.01)
  *H01L 51/56* (2006.01)

(56) References Cited

U.S. PATENT DOCUMENTS

| | | | |
|---|---|---|---|
| 2008/0029742 A1 | 2/2008 | Yoshimoto et al. | |
| 2010/0159279 A1 | 6/2010 | Kato et al. | |
| 2010/0167192 A1* | 7/2010 | Yamada | G03G 5/0532 430/66 |
| 2011/0309305 A1* | 12/2011 | Jakli | H01B 1/122 252/500 |
| 2013/0037753 A1 | 2/2013 | Ishitsuka et al. | |
| 2013/0052571 A1* | 2/2013 | Yamada | G03G 15/75 430/56 |
| 2013/0052573 A1* | 2/2013 | Sasaki | G03G 15/75 430/56 |
| 2013/0327992 A1* | 12/2013 | Edgington | C08G 73/0266 252/389.24 |
| 2014/0227815 A1 | 8/2014 | Nakaie et al. | |

FOREIGN PATENT DOCUMENTS

| | | |
|---|---|---|
| JP | 2009-237165 A | 10/2009 |
| JP | 2009-289474 A | 12/2009 |
| JP | 2011-57589 A | 3/2011 |
| JP | 2013-222688 A | 10/2013 |
| WO | WO 2006/025342 A1 | 3/2006 |
| WO | WO 2008/032616 A1 | 3/2008 |
| WO | WO 2010/058777 A1 | 5/2010 |
| WO | WO 2011/132702 A1 | 10/2011 |
| WO | WO 2013/042623 A1 | 3/2013 |

OTHER PUBLICATIONS

Sun et al "Next-Generation transparent electrode materials for organic solar cells", Organic Solar Cells edtided ny Qiquan Qiao, Chapters, pp. 47-52, 2015.*
Office Action dated Jan. 29, 2018, in Chinese Patent Application No. 201580029744.9.
International Search Report for PCT/JP2015/065858 (PCT/ISA/210) dated Jul. 14, 2015.
Written Opinion of the International Searching Authority for PCT/JP2015/065858 (PCT/ISA/237) dated Jul. 14, 2015.
Extended European Search Report dated Jan. 22, 2018, in European Patent Application No. 15802778.9.

* cited by examiner

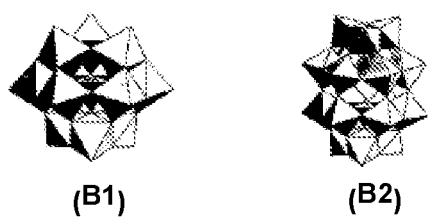

CHARGE-TRANSPORTING VARNISH

TECHNICAL FIELD

This invention relates to a charge-transporting varnish. More specifically, the invention relates to a charge-transporting varnish that contains a nonionic fluorine-containing surfactant.

BACKGROUND ART

With organic electroluminescent (EL) devices expected to see practical application in such fields as displays and lighting, various research is being carried out on the materials and device structures in order to achieve such properties as low-voltage driving, high brightness, and longevity.

A plurality of functional thin films are used in organic EL devices. One of these thin films—the hole injection layer, is responsible for transferring charge between an anode and a hole-transporting layer or an emissive layer, and thus serves an important function in achieving low-voltage driving and high brightness in organic EL devices.

Processes for forming this hole injection layer are broadly divided into dry processes such as vapor deposition and wet processes such as spin coating. On comparing these processes, wet processes are better able to efficiently produce thin films having a high flatness over a large surface area and therefore are often used particularly in the field of displays.

In light of such circumstances, the inventors have developed various types of charge-transporting varnishes containing aniline derivatives as charge-transporting substances (see Patent Documents 1 to 4). However, improvements in the wet process materials for hole injection layers are constantly being sought. In particular, because they can help improve the brightness characteristics or longevity characteristics of organic EL devices, there is a growing desire for materials which provide charge-transporting thin films of excellent flatness.

PRIOR ART DOCUMENTS

Patent Documents

Patent Document 1: WO 2006/025342
Patent Document 2: WO 2008/032616
Patent Document 3: WO 2010/058777
Patent Document 4: WO 2013/042623

SUMMARY OF THE INVENTION

Problems to be Solved by the Invention

Accordingly, an object of this invention is to provide a charge-transporting varnish that gives a charge-transporting thin film having a good flatness.

Means for Solving the Problems

The inventor has conducted extensive investigations, as a result of which he has discovered that by using a charge-transporting varnish prepared by including, within a composition containing a charge-transporting substance and an organic solvent, a nonionic fluorine-containing surfactant having a perfluoroalkenyl group-containing perfluorohydrocarbon structure and an alkylene oxide structure, the flatness of the resulting thin film, such as the flatness of the film within a pixel when the varnish is employed on a pixel substrate having banks, can be improved.

Accordingly, the invention provides:

1. A charge-transporting varnish comprising a charge-transporting substance, a nonionic fluorine-containing surfactant and an organic solvent, wherein the nonionic fluorine-containing surfactant has a perfluoroalkenyl group-containing perfluorohydrocarbon structure and an alkylene oxide structure;

2. The charge-transporting varnish of 1 above, wherein the perfluoroalkenyl group is a branched-chain perfluoroalkenyl group;

3. The charge-transporting varnish of 1 or 2 above, wherein the perfluoroalkenyl group-containing perfluorohydrocarbon structure is represented by any one of formulas (1) to (3)

[Chemical Formula 1]

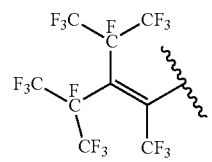

(1)

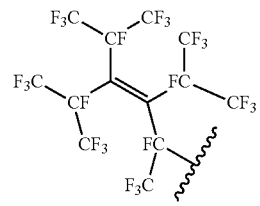

(2)

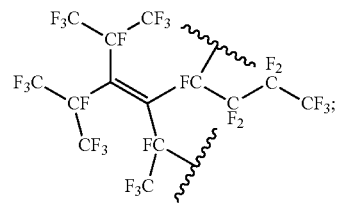

(3)

4. The charge-transporting varnish of any of 1 to 3 above, wherein the alkylene oxide structure includes a group of the formula -(A$^O$O)$_n$— (wherein A$^O$ is an alkylene group of 2 to 10 carbon atoms, and n is an integer from 2 to 50);

5. The charge-transporting varnish of 4 above, wherein the alkylene oxide structure has the formula —(CH$_2$CH$_2$O)$_n$— (wherein n is as defined above);

6. The charge-transporting varnish of any one of 1 to 5 above which further includes a dopant substance;

7. A charge-transporting thin film produced using the charge-transporting varnish of any one of 1 to 6 above;

8. An electronic device comprising the charge-transporting thin film of 7 above;

9. An organic electroluminescent device comprising the charge-transporting thin film of 7 above;

10. The organic electroluminescent device of 9 above, wherein the charge-transporting thin film is a hole injection layer; and 11. A method for producing a charge-transporting thin-film, the method being characterized by the steps of applying the charge-transporting varnish of any one of 1 to 6 above onto a substrate, and evaporating off the solvent.

Advantageous Effects of the Invention

Because the charge-transporting varnish of the invention includes a specific nonionic fluorine-containing surfactant, this varnish can be used to form, for example, a thin film of excellent flatness even within a pixel on a pixel substrate having banks, and thus is suitable for the production of a high-flatness thin film.

Moreover, although the thin film obtained from the charge-transporting varnish of the invention includes a nonionic fluorine-containing surfactant, the contact angle of solvents on the surface thereof does not differ much from that of a thin film containing no surfactant.

In addition, although the charge-transporting thin film of the invention includes a nonionic fluorine-containing surfactant that is an insulating material, it does not exert an adverse influence on the characteristics of organic EL devices provided with the thin film.

Therefore, the charge-transporting varnish of the invention can be advantageously used for thin film production in organic EL devices and other electronic devices, and is particularly suitable for the production of a hole injection layer in an organic EL device.

Also, the charge-transporting varnish of the invention, even when use is made of various wet processes capable of forming a film over a large surface area, such as spin coating and slit coating, can reproducibly form a thin film of excellent charge transportability, and thus is capable of fully accommodating recent advances in the field of organic EL devices.

BRIEF DESCRIPTION OF THE DRAWING

The FIGURE shows a Keggin-type chemical structure in formula (B1) and a Dawson-type chemical structure in formula (B2).

EMBODIMENT FOR CARRYING OUT THE INVENTION

The invention is described more fully below.

The charge-transporting varnish of the invention includes a charge-transporting substance, a nonionic fluorine-containing surfactant and an organic solvent. The nonionic fluorine-containing surfactant has a perfluoroalkenyl group-containing perfluorohydrocarbon structure and an alkylene oxide structure.

The perfluoroalkenyl group-containing perfluorohydrocarbon structure of the nonionic fluorine-containing surfactant used in the invention is not particularly limited and may be linear or branched. However, in this invention, a structure containing a branched chain is preferred, and a structure containing a branched-chain perfluoroalkenyl group is more preferred.

The number of carbons thereon is not particularly limited, although the number of carbons is preferably about 2 to 20, more preferably 5 to 20, and even more preferably 5 to 15.

Preferred perfluoroalkenyl group-containing perfluorohydrocarbon structures include, but are not limited to, α-perfluorononenyl structures of formula (1) and structures of formulas (2) and (3).

[Chemical Formula 2]

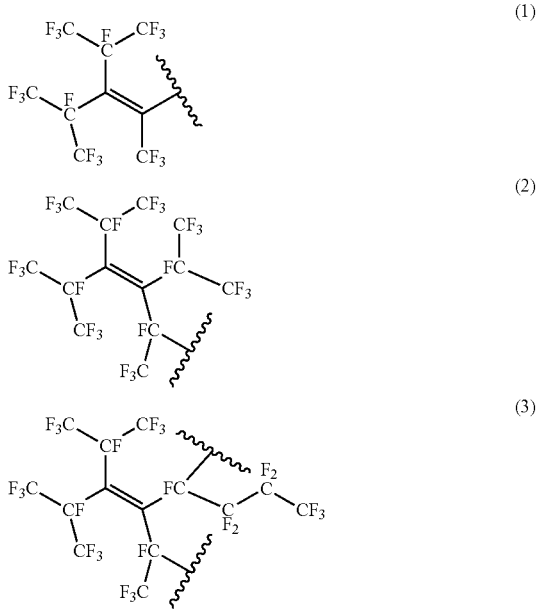

The alkylene oxide structure is not particularly limited, although an alkylene oxide structure which includes a group of the formula $-(A^O O)_n-$ (wherein $A^O$ is an alkylene group of 2 to 10 carbon atoms, and n is an integer from 2 to 50) is preferred, and a structure containing an ethylene oxide group of the formula $-(CH_2CH_2O)_n-$ (wherein n is as defined above) is more preferred.

Examples of alkylene groups of 2 to 10 carbon atoms include ethylene, propylene, trimethylene, tetramethylene, pentamethylene, hexamethylene, heptamethylene, octamethylene, nonamethylene and decamethylene groups.

The alkylene oxide chain may be partly branched, or a carbonyl group may be present on the alkylene chain.

Letting the perfluoroalkenyl group-containing perfluorohydrocarbon structure be $R_f$, nonionic fluorine-containing surfactants that can be suitably used in the invention are exemplified by, but not limited to, those of formula (A1) or (A2) for the structures of formulas (1) and (2), and those of formula (A3) for the structure of formula (3).

$R_f-O-(A^O O)_n-R^O$ (A1)

$R_f-O-(A^O O)_n-R_f$ (A2)

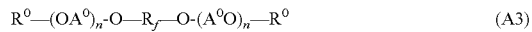
$R^O-(OA^O)_n-O-R_f-O-(A^O O)_n-R^O$ (A3)

In the formulas, each $R_f$ is independently a perfluoroalkenyl group-containing perfluorohydrocarbon structure, each $R^O$ is independently a hydrogen atom or an alkyl group of 1 to 20 carbon atoms, and $A^O$ and n are as defined above.

The alkyl groups of 1 to 20 carbon atoms may be linear, branched or cyclic. Illustrative examples include linear or branched alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

More preferably, Rf—O— is an α-perfluorononenyloxy structure represented by formula (1') and $A^O$ is an ethylene group. Specific examples include α-perfluorononenyloxy-ω-methylpolyethylene oxide and α-perfluorononenyloxy-ω-perfluorononenylpolyethylene oxide.

[Chemical Formula 3]

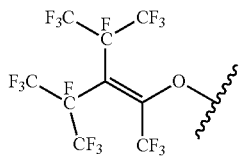
(1')

Nonionic fluorine-containing surfactants that may be used in this invention can be synthesized by the methods described in, for example, JP-A 2010-47680, JP-A 2011-57589 or JP-A 2012-72287, or may be acquired as commercial products.

Examples of commercial products include the following nonionic fluorine-containing surfactants from Neos Co., Ltd.: the FTERGENT M series (251, 212M, 215M, 250 (α-perfluorononenyloxy-ω-methylpolyethylene oxide)), F series (209F, 222F, 245F), G series (208G, 218GL, 240G), P and D series (212P, 220P, 228P, FTX-218, DFX-18), and oligomer series (710FL, 710FM, 710FS, 730FL, 730LM). Of these, the M series, F series, G series, P and D series (212P, 220P, 228P) and oligomer series (710FL, 710FM, 710FS) are preferred.

In this invention, the nonionic fluorine-containing surfactant may be used singly or two or more may be used in combination.

The amount of nonionic fluorine-containing surfactant used is not particularly limited, provided the desired leveling effect is exhibited and the surfactant does not have an adverse effect on the contact angle of the resulting thin film and on the organic EL device characteristics. The amount of use in the charge-transporting varnish is preferably from about 0.001 to about 10 wt %, more preferably from 0.01 to 5 wt %, and even more preferably from 0.01 to 2 wt %.

The charge-transporting substance used in this invention is not limited, provided it is a charge-transporting monomer, charge-transporting oligomer or polymer hitherto used in organic EL devices, although a charge-transporting oligomer is preferred.

The charge-transporting oligomer is exemplified by various types of hole-transporting substances, such as aniline derivatives, thiophene derivatives and pyrrole derivatives. Of these, aniline derivatives and thiophene derivatives are preferred, and aniline derivatives are more preferred.

The molecular weight of the charge-transporting oligomer is generally from 200 to 5,000, although from the standpoint of preparing a varnish that gives thin films having a high charge transportability, the molecular weight is preferably at least 300, more preferably at least 400, and even more preferably at least 500. From the standpoint of preparing a uniform varnish that gives thin films having a high flatness, the molecular weight is preferably not more than 4,000, more preferably not more than 3,000, and even more preferably not more than 2,000.

Examples of aniline derivatives include, but are not limited to, those of formula (4).

[Chemical Formula 4]

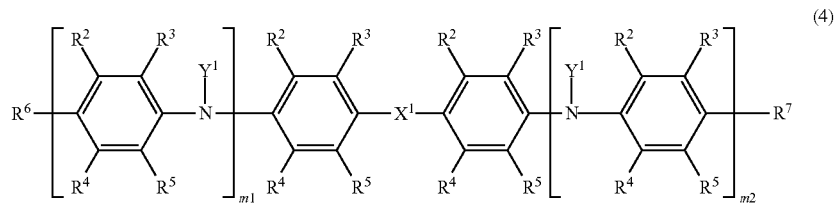
(4)

In formula (4), $X^1$ represents $-NY^1-$, $-O-$, $-S-$, $-(CR^8R^9)_L-$ or a single bond. When m1 or m2 is 0, $X^1$ represents $-NY^1-$.

Each $Y^1$ is independently a hydrogen atom, an alkyl group of 1 to 20 carbon atoms, alkenyl group of 2 to 20 carbon atoms or alkynyl group of 2 to 20 carbon atoms which may be substituted with $Z^7$, or an aryl group of 6 to 20 carbon atoms or heteroaryl group of 2 to 20 carbon atoms which may be substituted with $Z^8$.

The alkyl group of 1 to 20 carbons is exemplified in the same way as above.

Illustrative examples of alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Illustrative examples of alkynyl groups of 2 to 20 carbon atoms include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Illustrative examples of aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Illustrative examples of heteroaryl groups of 2 to 20 carbon atoms include 2-thienyl, 3-thienyl, 2-furanyl, 3-furanyl, 2-oxazolyl, 4-oxazolyl, 5-oxazolyl, 3-isooxazolyl, 4-isooxazolyl, 5-isooxazolyl, 2-thiazolyl, 4-thiazolyl, 5-thiazolyl, 3-isothiazolyl, 4-isothiazolyl, 5-isothiazolyl, 2-imidazolyl, 4-imidazolyl, 2-pyridyl, 3-pyridyl and 4-pyridyl groups.

$R^8$ and $R^9$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^7$, an aryl group of 6 to 20 carbon atoms or heteroaryl group of 2 to 20 carbon atoms which may be substituted with $Z^8$, or a $-NHY^2$, $-NY^3Y^4$, $-C(O)Y^5$, $-OY^6$, $-SY^7$, $-SO_3Y^8$, $-C(O)OY^9$, $-OC(O)Y^{10}$, $-C(O)NHY^{11}$ or $-C(O)NY^{12}Y^{13}$ group.

$Y^2$ to $Y^{13}$ are each independently an alkyl group of 1 to 20 carbon atoms, alkenyl group of 2 to 20 carbon atoms or alkynyl group of 2 to 20 carbon atoms which may be substituted with $Z^7$, or an aryl group of 6 to 20 carbon atoms or heteroaryl group of 2 to 20 carbon atoms which may be substituted with $Z^8$.

$Z^7$ is a halogen atom, a nitro group, a cyano group, an amino group, an aldehyde group, a hydroxyl group, a thiol group, a sulfonic acid group, a carboxylic acid group, or an aryl group of 6 to 20 carbon atoms or heteroaryl group of 2 to 20 carbon atoms which may be substituted with $Z^9$.

$Z^8$ is a halogen atom, a nitro group, a cyano group, an amino group, an aldehyde group, a hydroxyl group, a thiol group, a sulfonic acid group, a carboxylic acid group, or an alkyl group of 1 to 20 carbon atoms, alkenyl group of 2 to 20 carbon atoms or alkynyl group of 2 to 20 carbon atoms which may be substituted with $Z^9$.

$Z^9$ is a halogen atom, a nitro group, a cyano group, an amino group, an aldehyde group, a hydroxyl group, a thiol group, a sulfonic acid group or a carboxylic acid group.

Examples of halogen atoms include fluorine, chlorine, bromine and iodine atoms.

Also, the alkyl groups, alkenyl groups, alkynyl groups, aryl groups and heteroaryl groups of $R^7$ to $R^8$ and $Y^2$ to $Y^{10}$ are exemplified in the same way as above.

Of these, $R^8$ and $R^9$ are preferably hydrogen atoms or alkyl groups of 1 to 20 carbon atoms which may be substituted with $Z^7$, more preferably hydrogen atoms or methyl groups which may be substituted with $Z^7$, and most preferably both hydrogen atoms.

L, which represents the number of divalent alkylene recurring units of the formula $-(CR^8R^9)-$, is an integer from 1 to 20, preferably from 1 to 10, more preferably from 1 to 5, even more preferably 1 or 2, and most preferably 1.

When L is 2 or more, the plurality of $R^8$ groups may be mutually the same or different, and the plurality of $R^9$ groups may be mutually the same or different.

In particular, $X^1$ is preferably $-NY^1-$ or a single bond. $Y^1$ is preferably a hydrogen atom or an alkyl group of 1 to 20 carbon atoms which may be substituted with $Z^7$, more preferably a hydrogen atom or a methyl group which may be substituted with $Z^7$, and most preferably a hydrogen atom.

$R^2$ to $R^5$ are each independently a hydrogen atom, a halogen atom, a nitro group, a cyano group, an amino group, an aldehyde group, a hydroxyl group, a thiol group, a sulfonic acid group, a carboxylic acid group, an alkyl group of 1 to 20 carbon atoms, alkenyl group of 2 to 20 carbon atoms or alkynyl group of 2 to 20 carbon atoms which may be substituted with $Z^7$, an aryl group of 6 to 20 carbon atoms or heteroaryl group of 2 to 20 carbon atoms which may be substituted with $Z^8$, or $-NHY^2$, $-NY^3Y^4$, $-C(O)Y^5$, $-OY^6$, $-SY^7$, $-C(O)Y^9$, $-OC(O)Y^{10}$, $-C(O)NHY^{11}$ or $-C(O)NY^{12}Y^{13}$ (wherein $Y^2$ to $Y^{13}$ are as defined above). These halogen atoms, alkyl groups, alkenyl groups, alkynyl groups, aryl groups and heteroaryl groups are as defined above.

In particular, in formula (4), $R^2$ to $R^5$ are preferably hydrogen atoms, halogen atoms, alkyl groups of 1 to 10 carbon atoms which may be substituted with $Z^7$, or aryl groups of 6 to 14 carbon atoms which may be substituted with $Z^8$; more preferably hydrogen atoms, fluorine atoms, or alkyl groups of 1 to 10 carbon atoms which may be substituted with fluorine atoms; and most preferably all hydrogen atoms.

$R^6$ and $R^7$ are preferably hydrogen atoms, halogen atoms, alkyl groups of 1 to 10 carbon atoms which may be substituted with $Z^7$, aryl groups of 6 to 14 carbon atoms which may be substituted with $Z^9$, or diphenylamino groups which may be substituted with $Z^8$ ($-NY^3Y^4$ groups wherein $Y^3$ and $Y^4$ are phenyl groups which may be substituted with $Z^8$); more preferably hydrogen atoms, fluorine atoms, or diphenylamino groups which may be substituted with fluorine atoms; and even more preferably both hydrogen atoms or both diphenylamino groups.

Of these, combinations in which $R^2$ to $R^5$ are hydrogen atoms, fluorine atoms or alkyl groups of 1 to 10 carbon atoms which may be substituted with fluorine atoms, $R^6$ and $R^7$ are hydrogen atoms, fluorine atoms or diphenylamino groups which may be substituted with fluorine atoms, $X^1$ is or a single bond, and $Y^1$ is a hydrogen atom or a methyl group are preferred. Combinations in which $R^2$ to $R^5$ are hydrogen atoms, $R^6$ and $R^7$ are both hydrogen atoms or diphenylamino groups, and $X^1$ is $-NH-$ or a single bond are more preferred.

In formula (4), m1 and m2 each independently represent an integer of 0 or more and satisfy the condition $1 \leq m1+m2 \leq 20$. Taking into account the balance between the charge transportability of the resulting thin film and the solubility of the aniline derivative, m1 and m2 preferably satisfy the condition $2 \leq m1+m2 \leq 8$, more preferably satisfy the condition $2 \leq m1+m2 \leq 6$, and still more preferably satisfy the condition $2 \leq m1+m2 \leq 4$.

In particular, in $Y^1$ to $Y^{13}$ and $R^2$ to $R^9$, the substituent $Z^7$ is preferably a halogen atom or an aryl group of 6 to 20 carbon atoms which may be substituted with $Z^8$, more preferably a halogen atom or a phenyl group which may be substituted with $Z^9$, and most preferably does not exist (i.e., is non-substituting).

The substituent $Z^8$ is preferably a halogen atom or an alkyl group of 1 to 20 carbon atoms which may be substituted with $Z^9$, more preferably a halogen atom or an alkyl group of 1 to 4 carbon atoms which may be substituted with $Z^9$, and most preferably does not exist (i.e., is non-substituting).

$Z^9$ is preferably a halogen atom, more preferably a fluorine atom, and most preferably does not exist (i.e., is non-substituting).

In $Y^1$ to $Y^{13}$ and $R^2$ to $R^9$, the number of carbon atoms on the alkyl, alkenyl and alkynyl groups is preferably 10 or less, more preferably 6 or less, and even more preferably 4 or less.

The number of carbon atoms on the aryl and heteroaryl groups is preferably 14 or less, more preferably 10 or less, and even more preferably 6 or less.

The molecular weight of the aniline derivative is generally from 300 to 5,000. However, from the standpoint of increasing solubility, the molecular weight is preferably not more than 4,000, more preferably not more than 3,000, and even more preferably not more than 2,000.

Examples of methods for synthesizing the aniline derivative include, but are not particularly limited to, the methods described in Bulletin of Chemical Society of Japan, 67, pp. 1749-1752 (1994); Synthetic Metals, 84, pp. 119-120

(1997); Thin Solid Films, 520 (24), pp. 7157-7163 (2012), WO 2008/032617, WO 2008/032616, WO 2008/129947 and WO 2013/084664.

Examples of aniline derivatives of formula (4) include, but are not limited to, phenyldianilines, phenyltrianilines, phenyltetraanilines, phenylpentaanilines, tetraanilines (aniline tetramers), octaanilines (aniline octamers), hexadecaanilines (aniline 16-mers), and is by the following formulas:

[Chemical Formula 5]

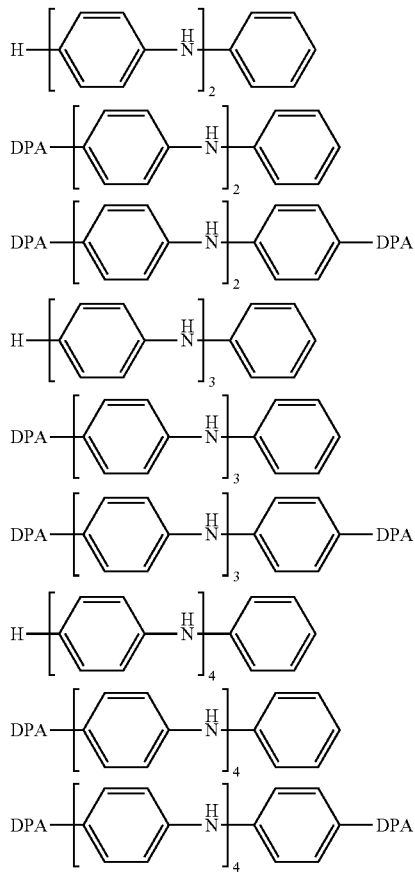

(wherein DPA stands for a diphenylamino group), and

[Chemical Formula 6]

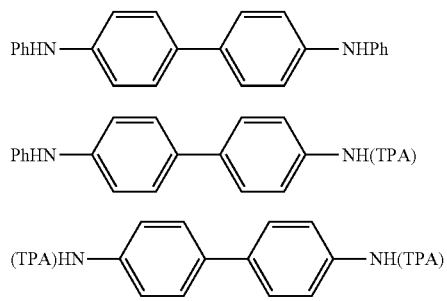

(wherein Ph stands for a phenyl group, and TPA stands for a p-(diphenylamino)phenyl group).

The charge-transporting varnish of the invention may optionally include a dopant substance for such purposes as to enhance the charge transportability.

The dopant substance is not particularly limited, provided it dissolves in at least one of the solvents used in the varnish. Use may be made of either an inorganic dopant substance or an organic dopant substance.

Examples of inorganic dopant substances include inorganic acids such as hydrochloric acid, sulfuric acid, nitric acid and phosphoric acid; metal halides such as aluminum (III) chloride ($AlCl_3$), titanium(IV) tetrachloride ($TiCl_4$), boron tribromide ($BBr_3$), a boron trifluoride-ether complex ($BF_3 \cdot OEt_2$), iron(III) chloride ($FeCl_3$), copper(II) chloride ($CuCl_2$), antimony(V) pentachloride ($SbCl_5$), antimony(V) pentafluoride ($SbF_5$), arsenic(V) pentafluoride ($AsF_5$), phosphorus pentafluoride ($PF_5$) and tris(4-bromophenyl)aluminum hexachloroantimonate (TBPAH); halogens such as $Cl_2$, $Br_2$, $I_2$, ICl, $ICl_3$, IBr and $IF_4$; and heteropolyacids such as phosphomolybdic acid and phosphotungstic acid.

Examples of organic dopant substances include arylsulfone compounds such as benzenesulfonic acid, tosylic acid, p-styrenesulfonic acid, 2-naphthalenesulfonic acid, 4-hydroxybenzenesulfonic acid, 5-sulfosalicyclic acid, p-dodecylbenzenesulfonic acid, dihexylbenzenesulfonic acid, 2,5-dihexylbenzenesulfonic acid, dibutylnaphthalenesulfonic acid, 6,7-dibutyl-2-naphthalenesulfonic acid, dodecylnaphthalenesulfonic acid, 3-dodecyl-2-naphthalenesulfonic acid, hexylnaphthalenesulfonic acid, 4-hexyl-1-naphthalenesulfonic acid, octylnaphthalenesulfonic acid, 2-octyl-1-naphthalenesulfonic acid, hexylnaphthalensulfonic acid, 7-hexyl-1-naphthalenesulfonic acid, 6-hexyl-2-naphthalenesulfonic acid, dinonylnaphthalenesulfonic acid, 2,7-dinonyl-4-naphthalenesulfonic acid, dinonylnaphthalenedisulfonic acid, 2,7-dinonyl-4,5-naphthalenedisulfonic acid, the 1,4-benzodioxanedisulfonic acid compounds mentioned in WO 2005/000832, the arylsulfonic acid compounds mentioned in WO 2006/025342, the arylsulfonic acid compounds mentioned in WO 2009-096352, and polystyrenesulfonic acids; non-arylsulfone compounds such as 10-camphorsulfonic acid; and organic oxidizing agents such as 7,7,8,8-tetracyanoquinodimethane (TCNQ) and 2,3-dichloro-5,6-dicyano-1,4-benzoquinone (DDQ).

These inorganic and organic dopant substances may be used singly, or two or more may be used in combination.

Of these dopant substances, a heteropolyacid is preferred. By using a heteropolyacid as the dopant substance, it is possible to obtain a thin-film of excellent charge transportability that not only has a good ability to accept holes from transparent electrodes such as indium-tin oxide (ITO) or indium-zinc oxide (IZO), but also demonstrates a good ability to accept holes from metal anodes such as aluminum.

"Heteropolyacid" refers to a polyacid having a structure in which a heteroatom is positioned at the center of the molecule—typically the Keggin-type chemical structure shown in formula (B1) or the Dawson-type chemical structure shown in formula (B2) in the FIGURE, and which is obtained by the condensation of an isopolyacid that is an oxoacid of vanadium (V), molybdenum (Mo), tungsten (W) or the like with an oxoacid of a different element. Examples of such oxoacids of a different element include primarily oxoacids of silicon (Si), phosphorus (P) and arsenic (As).

Examples of heteropolyacids include phosphomolybdic acid, silicomolybdic acid, phosphotungstic acid, silicotungstic acid and phosphotungstomolybdic acid. These may be used singly, or two or more may be used in combination. The heteropolyacid used in this invention may be acquired as a commercial product or may be synthesized by a known method.

In particular, when a single heteropolyacid is used as the dopant substance, this single heteropolyacid is preferably phosphotungstic acid or phosphomolybdic acid, and most preferably phosphotungstic acid. When the dopant substance consists of two or more heteropolyacids, one of the two or more heteropolyacids is preferably phosphotungstic acid or phosphomolybdic acid, and more preferably phosphotungstic acid.

Even a heteropolyacid having, in quantitative analysis such as elemental analysis, numbers for the elements which are higher or lower than in the structure indicated by the general formula may be used in this invention, provided it was acquired as a commercial product or was suitably synthesized according to a known method of synthesis.

For example, phosphotungstic acid is generally represented by the chemical formula $H_3(PW_{12}O_{40}) \cdot nH_2O$, and phosphomolybdic acid is generally represented by the chemical formula $H_3(PMo_{12}O_{40}) \cdot nH_2O$. In quantitative analysis, regardless of whether the numbers for the elements P (phosphorus), O (oxygen) and W (tungsten) or Mo (molybdenum) in these formulas are high or low, so long as the heteropolyacid was acquired as a commercial product or suitably synthesized by a known method of synthesis, it may be used in this invention. In such cases, the mass of the heteropolyacid specified in this invention refers not to the mass of pure phosphotungstic acid within the product of synthesis or the commercial product (phosphotungstic acid content), but rather, in the form that is available as a commercial product or the form that can be isolated by a known method of synthesis, to the total mass in a state that includes water of hydration and other impurities.

An arylsulfonic acid compound may also be suitably used as the dopant substance. Arylsulfonic acid compounds of formula (5) or (6) are especially preferred.

[Chemical Formula 8]

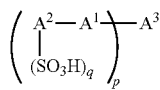

(5)

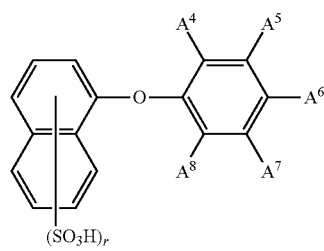

(6)

Here, $A^1$ is oxygen or sulfur, with oxygen being preferred.

$A^2$ is a naphthalene ring or an anthracene ring, with a naphthalene ring being preferred.

$A^3$ is a perfluorobiphenyl group having a valence of 2 to 4. The letter p represents the number of bonds between $A^1$ and $A^3$, this being an integer which satisfies the condition $2 \leq p \leq 4$. $A^3$ is preferably a divalent perfluorobiphenyl group, and p is preferably 2.

The letter q represents the number of sulfonic acid groups that bond with $A^2$, this being an integer that satisfies the condition 1 q 4, and most preferably 2.

$A^4$ to $A^8$ are each independently a hydrogen atom, a halogen atom, a cyano group, an alkyl group of 1 to 20 carbon atoms, a halogenated alkyl group of 1 to 20 carbon atoms or a halogenated alkenyl group of 2 to 20 carbon atoms, with at least three from among $A^4$ to $A^8$ being halogen atoms.

Examples of the halogenated alkyl group of 1 to 20 carbon atoms include trifluoromethyl, 2,2,2-trifluoroethyl, 1,1,2,2,2-pentafluoroethyl, 3,3,3-trifluoropropyl, 2,2,3,3,3-pentafluoropropyl, 1,1,2,2,3,3,3-heptafluoropropyl, 4,4,4-trifluorobutyl, 3,3,4,4,4-pentafluorobutyl, 2,2,3,3,4,4,4-heptafluorobutyl and 1,1,2,2,3,3,4,4,4-nonafluorobutyl groups.

Examples of the halogenated alkenyl group of 2 to 20 carbon atoms include perfluorovinyl, perfluoropropenyl (allyl) and perfluorobutenyl groups.

The halogen atom and the alkyl group of 1 to 20 carbon atoms are exemplified in the same way as above, with the halogen atom preferably being a fluorine atom.

Of these, $A^4$ to $A^8$ are preferably hydrogen atoms, halogen atoms, cyano groups, alkyl groups of 1 to 10 carbon atoms, halogenated alkyl groups of 1 to 10 carbon atoms, or halogenated alkenyl groups of 2 to 10 carbon atoms, with at least 3 from among $A^4$ to $A^8$ being fluorine atoms; more preferably hydrogen atoms, fluorine atoms, cyano groups, alkyl groups of 1 to 5 carbon atoms, fluorinated alkyl groups of 1 to 5 carbon atoms, or fluorinated alkenyl groups of 2 to 5 carbon atoms, with at least 3 from among $A^4$ to $A^8$ being fluorine atoms; and even more preferably hydrogen atoms, fluorine atoms, cyano groups, perfluoroalkyl groups of 1 to 5 carbon atoms, or perfluoroalkenyl groups of 1 to 5 carbon atoms, with A % $A^5$ and $A^8$ being fluorine atoms.

Here, "perfluoroalkyl group" refers to an alkyl group in which all the hydrogen atoms are substituted with fluorine atoms, and "perfluoroalkenyl group" refers to an alkenyl group in which all the hydrogen atoms are substituted with fluorine atoms.

Also, the letter r represents the number of sulfonic acid groups bonded to the naphthalene ring, this being an integer which satisfies the condition 1 S r 4, preferably from 2 to 4, and most preferably 2.

The molecular weight of the arylsulfonic acid compound used as a dopant substance is not particularly limited. However taking into account the solubility in the organic solvent when used together with a charge-transporting oligomer, the molecular weight is preferably not more than 2,000, and more preferably not more than 1,500.

Examples of arylsulfonic acid compounds that are preferred as dopant substances in this invention include, but are not limited to, the following.

[Chemical Formula 9]

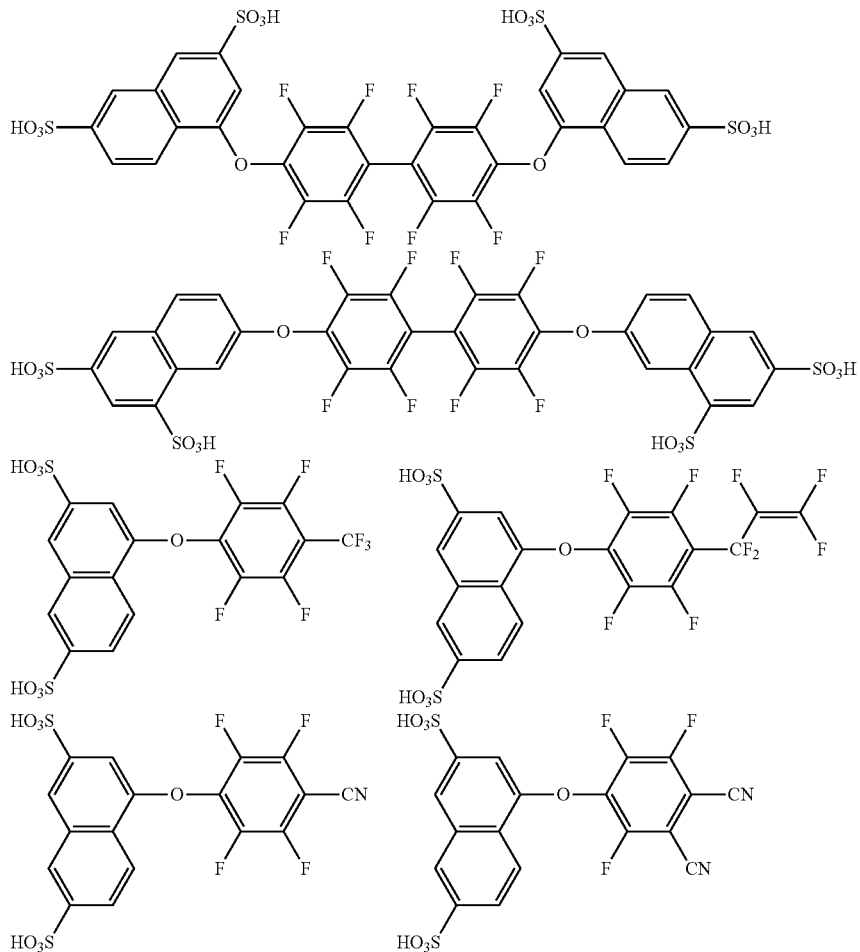

When a dopant substance is included in the charge-transporting varnish of the invention, the amount of dopant substance used is set as appropriate based on such considerations as the type of dopant substance and the desired degree of charge transportability, and thus cannot be strictly specified. Generally, however, the dopant substance is included in a mass ratio with respect to unity (1) for the charge-transporting substance in the range of 0.01 to 50.

Highly solvating solvents which are capable of dissolving well the charge-transporting substance, the nonionic fluorine-containing surfactant and the optionally used dopant substance may be used as the organic solvent employed when preparing the charge-transporting varnish.

Examples of such highly solvating solvents include, but are not limited to, organic solvents such as cyclohexanone, N,N-dimethylfoLmamide, N,N-dimethylacetamide, N-methylpyrrolidone, 1,3-dimethyl-2-imidazolidinone and diethylene glycol monomethyl ether. These solvents may be used singly, or two or more may be used in admixture. The amount used may be set to 5 to 100 wt %, based on the overall solvent used in the varnish.

The charge-transporting substance and the nonionic fluorine-containing surfactant are preferably in a state where both are either completely dissolved or uniformly dispersed in the solvent; and are more preferably completely dissolved.

In the practice of the invention, by including in the varnish at least one high-viscosity organic solvent having a viscosity at 25° C. of 10 to 200 mPa·s, especially 35 to 150 mPa·s, and a boiling point at standard pressure (atmospheric pressure) of 50 to 300° C., especially 150 to 250° C., the viscosity of the varnish is easily adjusted, thus making it possible to prepare a varnish which reproducibly gives thin films of high flatness and is suitable for the method of application to be used.

Examples of high-viscosity organic solvents include, but are not limited to, cyclohexanol, ethylene glycol, ethylene glycol diglycidyl ether, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol. These solvents may be used singly, or two or more may be used in admixture.

The amount of high-viscosity organic solvent added as a proportion of the overall solvent used in the varnish of the invention is preferably within a range where no precipitation of solids occurs. The amount of such addition is preferably from 5 to 90 wt %, provided that no precipitation of solids occurs.

In addition, other solvents may be admixed in a proportion with respect to the overall solvent used in the varnish of from 1 to 90 wt %, and preferably 1 to 50 wt %, for such purposes as to enhance the substrate wettability by the varnish, adjust the solvent surface tension, adjust the polarity, and adjust the boiling point.

Examples of such solvents include, but are not limited to, propylene glycol monomethyl ether, ethylene glycol monobutyl ether, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether acetate, diethylene glycol monoethyl ether, diacetone alcohol, γ-butyrolactone, ethyl lactate and n-hexyl acetate. These solvents may be used singly, or two or more may be used in admixture.

The viscosity of the inventive varnish is set as appropriate for the thickness and other properties of the thin film to be produced and the solids concentration in the varnish, but is generally from 1 to 50 mPa·s at 25° C.

The solids concentration of the charge-transporting varnish of this invention is set as appropriate based on such considerations as the viscosity, surface tension and other properties of the varnish and the thickness and other properties of the thin film to be produced, and is generally about 0.1 to 10.0 wt %. To improve the coating properties of the varnish, the solids concentration of the varnish is preferably about 0.5 to 5.0 wt %, and more preferably about 1.0 to 3.0 wt %.

A charge-transporting thin film can be formed on a substrate by applying the charge-transporting varnish described above onto the substrate and baking.

Examples of the method of applying the varnish include, but are not particularly limited to, dipping, spin coating, transfer printing, roll coating, brush coating, inkjet printing, spraying and slit coating. The viscosity and surface tension of the varnish are preferably adjusted according to the method of application to be used.

When using the varnish of the invention, the baking atmosphere is not particularly limited. A thin film having a uniform film surface and high charge transportability can be obtained not only in an open-air atmosphere, but even in an inert gas such as nitrogen or in a vacuum.

The baking temperature is suitably set in the range of about 100 to 260° C. while taking into account such factors as the intended use of the resulting thin film, the degree of charge transportability to be imparted to the thin-film, and the type and boiling point of the solvent. When the thin film thus obtained is to be used as a hole injection layer in an organic EL device, the baking temperature is preferably about 140 to 250° C., and more preferably about 145 to 240° C.

During baking, a temperature change in two or more steps may be applied for such purposes as to achieve more uniform film formability or to induce the reaction to proceed on the substrate. Heating may be carried out using a suitable apparatus such as a hot plate or an oven.

The thickness of the charge-transporting thin film is not particularly limited. However, when the thin film is to be used as a hole injection layer in an organic EL device, a film thickness of from 5 to 200 nm is preferred. Methods for changing the film thickness include, for example, changing the solids concentration in the varnish and changing the amount of solution on the substrate during application.

The materials and method employed to fabricate organic light-emitting diode (OLED) devices using the charge-transporting varnish of the invention are exemplified by, but not limited to, those mentioned below.

The electrode substrate to be used is preferably cleaned beforehand by liquid washing with, for example, a cleaning agent, alcohol or pure water. When the substrate is an anode substrate, it is preferably subjected to surface treatment such as UV/ozone treatment or oxygen-plasma treatment just prior to use. However, surface treatment need not be carried out if the anode material is composed primarily of organic substances.

A method of fabricating an OLED device having a hole injection layer made of a thin film obtained from the charge-transporting varnish of the invention is described below by way of illustration.

A hole injection layer is formed on an electrode by applying the charge-transporting varnish of the invention onto an anode substrate and baking in the manner described above. The workpiece is then introduced into a vacuum deposition system, where a hole-transporting layer, emissive layer, electron-transporting layer, electron-transporting layer/hole-blocking layer and cathode metal are vapor-deposited in this order to form the OLED device. Where necessary, an electron-blocking layer may be provided between the emissive layer and the hole-transporting layer.

Illustrative examples of anode materials include transparent electrodes such as indium-tin oxide (ITO) and indium-zinc oxide (IZO), and metal anodes made of a metal such as aluminum or an alloy of such a metal. An anode material on which planarizing treatment has been carried out is preferred. Use can also be made of polythiophene derivatives and polyaniline derivatives having high charge transportability.

Examples of other metals making up the metal anode include, but are not limited to, scandium, titanium, vanadium, chromium, manganese, iron, cobalt, nickel, copper, zinc, gallium, yttrium, zirconium, niobium, molybdenum, ruthenium, rhodium, palladium, cadmium, indium, scandium, lanthanum, cerium, praseodymium, neodymium, promethium, samarium, europium, gadolinium, terbium, dysprosium, holmium, erbium, thulium, ytterbium, hafnium, thallium, tungsten, rhenium, osmium, iridium, platinum, gold, titanium, lead, bismuth, and alloys thereof.

Specific examples of hole-transporting layer-forming materials include triarylamines such as (triphenylamine) dimer derivatives, [(triphenylamine) dimer] spirodimer, N,N'-bis(naphthalen-1-yl)-N,N'-bis(phenyl)benzidine (α-NPD), N,N'-bis(naphthalen-2-yl)-N,N'-bis(phenyl)benzidine, N,N'-bis(3-methylphenyl)-N,N'-bis(phenyl)benzidine, N,N'-bis(3-methylphenyl)-N,N'-bis(phenyl)-9,9-spirobifluorene, N,N'-bis(naphthalen-1-yl)-N,N'-bis(phenyl)-9,9-spirobifluorene, N,N'-bis(3-methylphenyl)-N,N'-bis(phenyl)-9,9-dimethylfluorene, N,N'-bis(naphthalen-1-yl)-N,N'-bis(phenyl)-9,9-dimethylfluorene, N,N'-bis(3-methylphenyl)-N,N'-bis(phenyl)-9,9-diphenylfluorene, N,N'-bis(naphthalen-1-yl)-N,N'-bis(phenyl)-9,9-diphenylfluorene, N,N'-bis(naphthalen-1-yl)-N,N'-bis(phenyl)-2,2'-dimethylbenzidine, 2,2',7,7'-tetrakis(N,N-diphenylamino)-9,9-spirobifluorene, 9,9-bis[4-(N,N-bis-biphenyl-4-yl-amino)phenyl]-9H-fluorene, 9,9-bis[4-(N,N-bis-naphthalen-2-yl-amino)phenyl]-9H-fluorene, 9,9-bis[4-(N-naphthalen-1-yl-N-phenylamino)phenyl]-9H-fluorene, 2,2',7,7'-tetrakis[N-naphthalenyl(phenyl)amino]-9,9-spirobifluorene, N,N'-bis(phenanthren-9-yl)-N,N'-bis(phenyl)benzidine, 2,2'-bis[N,N-bis(biphenyl-4-yl)amino]-9,9-spirobifluorene, 2,2'-bis(N,N-diphenylamino)-9,9-spirobifluorene, di[4-(N,N-di(p-tolyl)amino)phenyl]cyclohexane, 2,2',7,7'-tetra(N,N-di(p-tolyl))amino-9,9-spirobifluorene, N,N,N',N'-tetranaphthalen-2-ylbenzidine, N,N,N',N'-tetra(3-methylphenyl)-3,3'-dimethylbenzidine, N,N'-di(naphthalenyl)-N,N'-di(naphthalen-2-yl)benzidine, N,N,N',N'-tetra(naphthalenyl)benzidine, N,N'-di(naphthalen-2-yl)-N,N'-diphenylbenzidine-1-4-diamine, $N^1,N^4$-diphenyl-N¹,N⁴-di(m-tolyl)benzene-1,4-diamine, N²,N²,N⁶,N⁶-tetraphenylnaphthalene-2,6-diamine, tris(4-(quinolin-8-yl)phenyl)amine, 2,2'-bis(3-(N,N-di(p-tolyl)amino)phenyl)biphenyl, 4,4',4''-tris[3-methylphenyl(phenyl)amino]triphenylamine (m-MTDATA) and 4,4',4''-tris[1-naphthyl(phenyl)amino]triphenylamine (1-TNATA); and oligothiophenes such as 5,5''-bis-{4-[bis(4-methylphenyl)amino]phenyl}-2,2':5',2''-terthiophene (BMA-3T).

Specific examples of emissive layer-forming materials include tris(8-quinolinolate) aluminum(III) (Alq₃), bis(8-quinolinolate) zinc(II) (Znq₂), bis(2-methyl-8-quinolinolate)-(p-phenylphenolate) aluminum(III) (BAlq), 4,4'-bis(2,2-diphenylvinyl)biphenyl, 9,10-di(naphthalen-2-yl)anthracene, 2-t-butyl-9,10-di(naphthalen-2-yl)anthracene, 2,7-bis[9,9-di(4-methylphenyl)fluoren-2-yl]-9,9-di(4-methylphenyl)fluorene, 2-methyl-9,10-bis(naphthalen-2-yl)anthracene, 2-(9,9-spirobifluoren-2-yl)-9,9-spirobifluorene, 2,7-bis(9,9-spirobifluoren-2-yl)-9,9-spirobifluorene, 2-[9,9-di(4-methylphenyl)fluoren-2-yl]-9,9-di(4-methylphenyl)fluorene, 2,2'-dipyrenyl-9,9-spirobifluorene, 1,3,5-tris(pyren-1-yl)benzene, 9,9-bis[4-(pyrenyl)phenyl]-9H-fluorene, 2,2'-bi(9,10-diphenylanthracene), 2,7-dipyrenyl-9,9-spirobifluorene, 1,4-di(pyren-1-yl)benzene, 1,3-di(pyren-1-yl)benzene, 6,13-di(biphenyl-4-yl)pentacene, 3,9-di(naphthalen-2-yl)perylene, 3,10-di(naphthalen-2-yl)perylene, tris[4-(pyrenyl)phenyl]amine, 10,10'-di(biphenyl-4-yl)-9,9'-bianthracene, N,N'-di(naphthalen-1-yl)-N,N'-diphenyl[1,1':4',1'':4'',1'''-quaterphenyl]-4,4'''-diamine, 4,4'-di[10-(naphthalen-1-yl)anthracen-9-yl]biphenyl, dibenzo{[f,f']-4,4',7,7'-tetraphenyl}diindeno[1,2,3-cd:1',2',3'-lm]perylene, 1-(7-(9,9'-bianthracen-10-yl)-9,9-dimethyl-9H-fluoren-2-yl)pyrene, 1-(7-(9,9'-bianthracen-10-yl)-9,9-dihexyl-9H-fluoren-2-yl)pyrene, 1,3-bis(carbazol-9-yl)benzene, 1,3,5-tris(carbazol-9-yl)benzene, 4,4',4''-tris(carbazol-9-yl)triphenylamine, 4,4'-bis(carbazol-9-yl)biphenyl (CBP), 4,4'-bis(carbazol-9-yl)-2,2'-dimethylbiphenyl, 2,7-bis(carbazol-9-yl)-9,9-dimethylfluorene, 2,2',7,7'-tetrakis(carbazol-9-yl)-9,9-spirobifluorene, 2,7-bis(carbazol-9-yl)-9,9-di(p-tolyl)fluorene, 9,9-bis[4-(carbazol-9-yl)phenyl]fluorene, 2,7-bis(carbazol-9-yl)-9,9-spirobifluorene, 1,4-bis(triphenylsilyl)benzene, 1,3-bis(triphenylsilyl)benzene, bis(4-N,N-diethylamino-2-methylphenyl)-4-methylphenylmethane, 2,7-bis(carbazol-9-yl)-9,9-dioctylfluorene, 4,4''-di(triphenylsilyl)-p-terphenyl, 4,4'-di(triphenylsilyl)biphenyl, 9-(4-t-butylphenyl)-3,6-bis(triphenylsilyl)-9H-carbazole, 9-(4-t-butylphenyl)-3,6-ditrityl-9H-carbazole, 9-(4-t-butylphenyl)-3,6-bis(9-(4-methoxyphenyl)-9H-fluoren-9-yl)-9H-carbazole, 2,6-bis(3-(9H-carbazol-9-yl)phenyl)pyridine, triphenyl(4-(9-phenyl-9H-fluoren-9-yl)phenyl)silane, 9,9-dimethyl-N,N-diphenyl-7-(4-(1-phenyl-1H-benzo[d]imidazol-2-yl)phenyl-9H-fluoren-2-amine, 3,5-bis(3-(9H-carbazol-9-yl)phenyl)pyridine, 9,9-spirobifluoren-2-yldiphenylphosphine oxide, 9,9'-(5-triphenylsilyl)-1,3-phenylene)bis(9H-carbazole), 3-(2,7-bis(diphenylphosphoryl)-9-phenyl-9H-fluoren-9-yl)-9-phenyl-9H-carbazole, 4,4,8,8,12,12-hexa(p-tolyl)-4H-8H-12H-12C-azadibenzo[cd,mn]-pyrene, 4,7-di(9H-carbazol-9-yl)-1,10-phenanthroline, 2,2'-bis(4-(carbazol-9-yl)phenyl)biphenyl, 2,8-bis(diphenylphosphoryl)dibenzo[b,d]thiophene, bis(2-methylphenyl)diphenylsilane, bis[3,5-di(9H-carbazol-9-yl)phenyl]diphenylsilane, 3,6-bis(carbazol-9-yl)-9-(2-ethylhexyl)-9H-carbazole, 3-(diphenylphosphoryl)-9-(4-(diphenylphosphoryl)phenyl)-9H-carbazole and 3,6-bis[(3,5-diphenyl)phenyl]-9-phenylcarbazole.

The emissive layer may be formed by co-deposition of any of these materials with a light-emitting dopant.

Specific examples of light-emitting dopants include 3-(2-benzothiazolyl)-7-(diethylamino)coumarin, 2,3,6,7-tetrahydro-1,1,7,7-tetramethyl-1H,5H,11H-10-(2-benzothiazolyl)quinolidino[9,9a,1gh]coumarin, quinacridone, N,N'-dimethylquinacridone, tris(2-phenylpyridine) iridium(III) (Ir(ppy)₃), bis(2-phenylpyridine)(acetylacetonate) iridium (III) (Ir(ppy)₂(acac)) tris[2-(p-tolyl)pyridine] iridium(III) (Ir(mppy)₃), 9,10-bis[N,N-di(p-tolyl)amino]anthracene, 9,10-bis[phenyl(m-tolyl)amino]anthracene, bis[2-(2-hydroxyphenyl)benzothiazolate] zinc(II), N¹⁰,N¹⁰,N¹⁰',N¹⁰'-tetra(p-tolyl)-9,9'-bianthracene-10,10'-diamine, N¹⁰,N¹⁰,N¹⁰',N¹⁰'-tetraphenyl-9,9'-bianthracene-10,10'-diamine, N¹⁰,N¹⁰'-diphenyl-N¹⁰',N¹⁰'-dinaphthalenyl-9,9'-bianthracene-10,10'-diamine, 4,4'-bis(9-ethyl-3-carbazovinylene)-1,1'-biphenyl, perylene, 2,5,8,11-tetra-t-butylperylene, 1,4-bis[2-(3-N-ethylcarbazolyl)vinyl]benzene, 4,4'-bis[4-(di-p-tolylamino)styryl]biphenyl, 4-(di-p-tolylamino)-4'-[(di-p-tolylamino)styryl]stilbene, bis[(3,5-difluoro)-2-(2-pyridyl)phenyl-(2-carboxypyridyl)] iridium(III), 4,4'-bis[4-(diphenylamino)styryl]biphenyl, bis(2,4-difluorophenylpyridinato)tetrakis(1-pyrazolyl)borate iridium(III), N,N'-bis(naphthalen-2-yl)-N,N'-bis(phenyl)tris(9,9-dimethylfluorenylene), 2,7-bis{2-[phenyl(m-tolyl)amino]-9,9-dimethylfluoren-7-yl}-9,9-dimethylfluorene, N-(4-((E)-2-(6((E)-4-(diphenylamino)styryl)naphthalen-2-yl)vinyl)phenyl)-N-phenylbenzeneamine, fac-iridium(III) tris(1-phenyl-3-methylbenzimidazolin-2-ylidene-C,C²'), mer-iridium(III) tris(1-phenyl-3-methylbenzimidazolin-2-ylidene-C,C²'), 2,7-bis[4-(diphenylamino)styryl]-9,9-spirobifluorene, 6-methyl-2-(4-(9-(4-(6-methylbenzo[d]thiazol-2-yl)phenyl)-anthracen-10-yl)phenyl)benzo[d]thiazole, 1,4-di[4-(N,N-diphenyl)amino]styrylbenzene, 1,4-bis(4-(9H-carbazol-9-yl)styryl)benzene, (E)-6-(4-(diphenylamino)styryl)-N,N-diphenylnaphthalen-2-amine, bis(2,4-difluorophenylpyridinato)(5-(pyridin-2-yl)-1H-tetrazolate) iridium(III), bis(3-trifluoromethyl-5-(2-pyridyl)pyrazole)((2,4-difluorobenzyl)diphenylphosphinate) bis(3-trifluoromethyl-5-(2-pyridyl)pyrazolate)(benzyl-diphenylphosphinate) iridium(III), bis(1-(2,4-difluorobenzyl)-3-methylbenzimidazolium)(3-(trifluoromethyl)-5-(2-pyridyl)-1,2,4-triazolate) bis(3-trifluoromethyl-5-(2-pyridyl)pyrazolate)(4',6'-difluorophenylpyridinate) iridium(III), bis(4',6'-difluorophenylpyridinato)(3,5-bis(trifluoromethyl)-3-(2'-pyridyl)pyrrolate) iridium(III), bis(4',6'-difluorophenylpyridinato)(3-(trifluoromethyl)-5-(2-pyridyl)-1,2,4-triazolate) iridium (III), (Z)-6-mesityl-N-(6-mesitylquinolin-2(1H)-ylidene)quinolin-2-amine-BF₂, (E)-2-(2-(4-(dimethylamino)styryl)-6-methyl-4H-pyran-4-ylidene)malononitrile, 4-(dicyanomethylene)-2-methyl-6-julolidyl-9-enyl-4-H-pyran, 4-(dicyanomethylene)-2-methyl-6-(1,1,7,7-tetramethyl-julolidyl-9-enyl)-4H-pyran, 4-(dicyanomethylene)-2-t-butyl-6-(1,1,7,7-tetramethyl-julolidin-4-ylvinyl)-4H-pyran, tris(dibenzoylmethane) phenanthroline europium(III), 5,6,11,12-tetraphenylnaphthacene, bis(2-benzo[b]thiophen-2-yl-pyridine)(acetylacetonate) iridium(III), tris(1-phenylisoquinoline) iridium(III), bis(1-phenylisoquinoline)(acetylacetonate) iridium(III), bis[1-(9,9-dimethyl-9H-fluoren-2-yl)isoquinoline]-(acetylacetonate) iridium(III), bis[2-(9,9-dimethyl-9H-fluoren-2-yl)quinoline]-(acetylacetonate) iridium(III), tris[4,4'-di-t-butyl-(2,2')-bipyridine] ruthenium(III).bis(hexafluorophosphate), tris(2-phenylquinoline) iridium(III), bis-2-phenylquinoline)(acetylacetonate) iridium(III), 2,8-di-t-butyl-5,11-bis(4-t-butylphenyl)-6,12-diphenyltetracene, bis(2-phenylbenzothiazolate)(acetylacetonate) iridium(III), platinum 5,10,15,20-tetraphenyltetrabenzoporphyrin, osmium(II) bis(3-trifluoromethyl-5-(2-pyridine)pyrazolate)-dimethylphenylphosphine, osmium(II) bis(3-trifluoromethyl)-5-(4-t-butylpyridyl)-1,2,4-triazolate)diphenylmethylphosphine, osmium(II) bis(3-(trifluoromethyl)-5-(2-pyridyl)-1,2,4-triazole) dimethylphenylphosphine, osmium (II) bis(3-(trifluoromethyl)-5-(4-t-butylpyridyl)-1,2,4-triazolate)dimethylphenylphosphine, bis[2-(4-n-hexylphenyl)quinoline](acetylacetonate) iridium(III), tris[2-(4-n-hexylphenyl)quinoline] iridium(III), tris[2-phenyl-4-methylquinoline] iridium(III), bis(2-phenylquinoline)(2-(3-methylphenyl)pyridinate) iridium(III), bis(2-(9,9-diethylfluoren-2-yl)-1-phenyl-1H-benzo[d]-imidazolato) (acetylacetonate) iridium(III), bis(2-phenylpyridine)(3-(pyridin-2-yl)-2H-chromen-9-onate) iridium(III), bis(2-phenylquinoline)(2,2,6,6-tetramethylheptane-3,5-dionate) iridium(III), bis(phenylisoquinoline)(2,2,6,6-tetramethyl-heptane-3,5-dionate) iridium(III), iridium(III) bis(4-phenylthieno[3,2-c]pyridinato-N,$C^2$)-acetylacetonate, (E)-2-(2-t-butyl-6-(2-(2,6,6-trimethyl-2,4,5,6-tetrahydro-1H-pyrrolo[3,2,1-ij]quinolin-8-yl)vinyl)-4H-pyran-4-ylidene)-malononitrile, bis(3-trifluoromethyl-5-(1-isoquinolyl) pyrazolate)(methyl-diphenylphosphine) ruthenium, bis[(4-n-hexylphenyl)isoquinoline](acetylacetonate) iridium(III), platinum(II) octaethylporphin, bis(2-methyldibenzo[f,h]quinoxaline)(acetylacetonate) iridium(III) and tris[(4-n-hexylphenyl)isoquinoline] iridium(III).

Specific examples of electron-transporting layer/hole-blocking layer-forming materials include lithium 8-hydroxyquinolinolate, 2,2',2"-(1,3,5-benzinetriyl)-tris(1-phenyl-1-H-benzimidazole), 2-(4-biphenyl)-5-(4-t-butylphenyl)-1,3,4-oxadiazole, 2,9-dimethyl-4,7-diphenyl-1,10-phenanthroline, 4,7-diphenyl-1,10-phenanthroline, bis(2-methyl-8-quinolinolate)-4-(phenylphenolato)aluminum, 1,3-bis[2-(2,2'-bipyridin-6-yl)-1,3,4-oxadiazo-5-yl]benzene, 6,6'-bis[5-(biphenyl-4-yl)-1,3,4-oxadiazo-2-yl]-2,2'-bipyridine, 3-(4-biphenyl)-4-phenyl-5-t-butylphenyl-1,2,4-triazole, 4-(naphthalen-1-yl)-3,5-diphenyl-4H-1,2,4-triazole, 2,9-bis(naphthalen-2-yl)-4,7-diphenyl-1,10-phenanthroline, 2,7-bis[2-(2,2'-bipyridin-6-yl)-1,3,4-oxadiazo-5-yl]-9,9-dimethylfluorene, 1,3-bis[2-(4-t-butylphenyl)-1,3,4-oxadiazo-5-yl]benzene, tris(2,4,6-trimethyl-3-(pyridin-3-yl)phenyl)borane, 1-methyl-2-(4-(naphthalen-2-yl)phenyl)-1H-imidazo-[4,5f][1,10] phenanthroline, 2-(naphthalen-2-yl)-4,7-diphenyl-1,10-phenanthroline, phenyldipyrenylphosphine oxide, 3,3',5,5'-tetra[(m-pyridyl)phen-3-yl]biphenyl, 1,3,5-tris[(3-pyridyl)phen-3-yl]benzene, 4,4'-bis(4,6-diphenyl-1,3,5-triazin-2-yl) biphenyl, 1,3-bis[3,5-di(pyridin-3-yl)phenyl]benzene, bis (10-hydroxybenzo[h]quinolinato)beryllium, diphenylbis(4-(pyridin-3-yl)phenyl)silane and 3,5-di(pyren-1-yl)pyridine.

Examples of electron injection layer-forming materials include lithium oxide ($Li_2O$), magnesium oxide (MgO), alumina ($Al_2O_3$), lithium fluoride (LiF), sodium fluoride (NaF), magnesium fluoride ($MgF_2$), cesium fluoride (CsF), strontium fluoride ($SrF_2$), molybdenum trioxide ($MoO_3$), aluminum, Li(acac), lithium acetate and lithium benzoate.

Examples of cathode materials include aluminum, magnesium-silver alloys, aluminum-lithium alloys, lithium, sodium, potassium and cesium.

An example of an electron-blocking layer-forming material is tris(phenylpyrazole)iridium.

The fabrication of polymer LED (PLED) devices using the charge-transporting varnish of the invention, although not particularly limited, is exemplified by the following method.

A PLED device having a charge-transporting thin film formed using the charge-transporting varnish of the invention can be fabricated by, in the production of an OLED device as described above, successively forming a hole-transporting polymer layer and a light-emitting polymer layer instead of carrying out vacuum deposition operations for a hole-transporting layer, an emissive layer, an electron-transporting layer and an electron injection layer.

Specifically, the charge-transporting varnish of the invention is applied onto an anode substrate, thus forming a hole injection layer by the above method. A hole-transporting polymer layer and a light-emitting polymer layer are successively formed thereon, following which a cathode is vapor-deposited on top, thereby forming the PLED device.

The cathode and anode materials used here may be similar to those used when producing an OLED device as described above, and similar cleaning treatment and surface treatment may be carried out.

The method of forming the hole-transporting polymer layer and the light-emitting polymer layer is exemplified by a film-forming method in which a solvent is added to a hole-transporting polymer material or a light-emitting polymer material, or to the materials obtained by adding to these a dopant substance, thereby dissolving or uniformly dispersing the materials, following which the resulting solutions or dispersions are applied onto a hole injection layer or a hole-transporting polymer layer, and are subsequently baked.

Specific examples of hole-transporting polymer materials include poly[(9,9-dihexylfluorenyl-2,7-diyl)-co-(N,N'-bis{p-butylphenyl}-1,4-diaminophenylene)], poly[(9,9-dioctylfluorenyl-2,7-diyl)-co-(N,N'-bis{p-butylphenyl}-1,1'-biphenylene-4,4-diamine)], poly[(9,9-bis{1'-penten-5'-yl}fluorenyl-2,7-diyl)-co-(N,N'-bis{p-butylphenyl}-1,4-diaminophenylene)], poly[(N,N'-bis(4-butylphenyl)-N,N'-bis(phenyl)benzidine) end-capped with polysilsesquioxane and poly[(9,9-dioctylfluorenyl-2,7-diyl)-co-(4,4'-(N-(p-butylphenyl))diphenylamine)].

Specific examples of light-emitting polymer materials include polyfluorene derivatives such as poly(9,9-dialkylfluorene) (PDAF), poly(phenylene vinylene) derivatives such as poly(2-methoxy-5-(2'-ethylhexoxy)-1,4-phenylene vinylene) (MEH-PPV), polythiophene derivatives such as poly(3-alkylthiophene) (PAT), and polyvinylcarbazole (PVCz).

Examples of the solvent include toluene, xylene and chloroform. Examples of the method of dissolution or uniform dispersion include stirring, stirring under applied heat, and ultrasonic dispersion.

The method of application is exemplified by, but not particularly limited to, inkjet printing, spraying, dipping, spin coating, transfer printing, roll coating and brush coating. Application is preferably carried out in an inert gas atmosphere such as nitrogen or argon.

Examples of the baking method include methods that involve heating in an oven or on a hot plate, either within an inert gas atmosphere or in a vacuum.

EXAMPLES

Working Examples and Comparative Examples are given below to more concretely illustrate the invention, although the invention is not limited by these Examples. The equipment used was as follows.

(1) Substrate Cleaning:
Substrate cleaning machine (reduced-pressure plasma system), from Choshu Industry Co., Ltd.
(2) Application of Varnish:
MS-A100 Spin Coater, from Mikasa Co., Ltd.
(3) Film Thickness Measurement and Flatness Evaluation:
Surf corder ET-4000 microfigure measuring instrument, from Kosaka Laboratory, Ltd.
(4) Measurement of Contact Angle:
Contact angle meter, from Kyowa Interface Science Co., Ltd.
(5) EL Device Fabrication:
C-E2L1G1-N Multifunction Vapor Deposition System, from Choshu Industry Co., Ltd.
(6) EL Device Lifetime Measurement:
PEL-105S Organic EL Brightness Life Evaluation System, from EHC K.K.

[1] Preparation of Charge-Transporting Varnishes

[Preparation Example 1] Charge-Transporting Varnish A

Charge-Transporting Varnish A was prepared by dissolving 0.137 g of the aniline derivative of formula [1] synthesized according to the method described in WO 2013/084664, 0.271 g of the arylsulfonic acid of formula [2] synthesized according to the method described in WO 2006/025342 and 0.02 g of the nonionic fluorine-containing surfactant FTERGENT 251 (Neos Co., Ltd.) in 6.6 g of 1,3-dimethyl-2-imidazolidinone under a nitrogen atmosphere, and then successively adding 8.0 g of 2,3-butanediol and 5.4 g of dipropylene glycol monomethyl ether to the resulting solution and stirring.

[Chemical Formula 10]

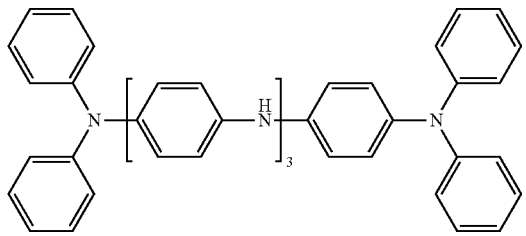

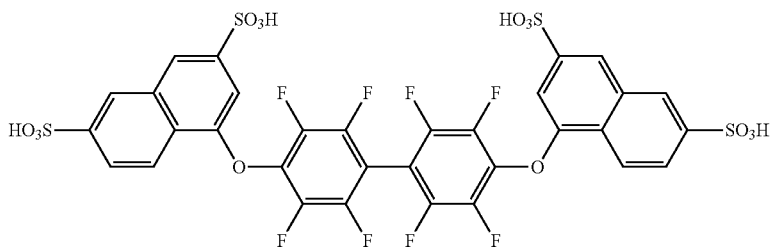

[Preparation Example 2] Charge-Transporting Varnish B

Aside from using FTERGENT 212M (Neos Co., Ltd.) instead of FTERGENT 251, Charge-Transporting Varnish B was prepared by the same method as in Preparation Example 1.

[Preparation Example 3] Charge-Transporting Varnish C

Aside from using FTERGENT 215M (Neos Co., Ltd.) instead of FTERGENT 251, Charge-Transporting Varnish C was prepared by the same method as in Preparation Example 1.

[Preparation Example 4] Charge-Transporting Varnish D

Aside from using FTERGENT 250 (Neos Co., Ltd.) instead of FTERGENT 251, Charge-Transporting Varnish D was prepared by the same method as in Preparation Example 1.

[Preparation Example 5] Charge-Transporting Varnish E

Aside from using FTERGENT 209F (Neos Co., Ltd.) instead of FTERGENT 251, Charge-Transporting Varnish E was prepared by the same method as in Preparation Example 1.

[Preparation Example 6] Charge-Transporting Varnish F

Aside from using FTERGENT 222F (Neos Co., Ltd.) instead of FTERGENT 251, Charge-Transporting Varnish F was prepared by the same method as in Preparation Example 1.

[Preparation Example 7] Charge-Transporting Varnish G

Aside from using FTERGENT 245F (Neos Co., Ltd.) instead of FTERGENT 251, Charge-Transporting Varnish G was prepared by the same method as in Preparation Example 1.

[Preparation Example 8] Charge-Transporting Varnish H

Aside from using FTERGENT 208G (Neos Co., Ltd.) instead of FTERGENT 251, Charge-Transporting Varnish H was prepared by the same method as in Preparation Example 1.

[Preparation Example 9] Charge-Transporting Varnish I

Aside from using FTERGENT 240G (Neos Co., Ltd.) instead of FTERGENT 251, Charge-Transporting Varnish I was prepared by the same method as in Preparation Example 1.

[Preparation Example 10] Charge-Transporting Varnish J

Aside from using FTERGENT 212P (Neos Co., Ltd.) instead of FTERGENT 251, Charge-Transporting Varnish J was prepared by the same method as in Preparation Example 1.

[Preparation Example 11] Charge-Transporting Varnish K

Aside from using FTERGENT 220P (Neos Co., Ltd.) instead of FTERGENT 251, Charge-Transporting Varnish K was prepared by the same method as in Preparation Example 1.

[Preparation Example 12] Charge-Transporting Varnish L

Aside from using FTERGENT 228P (Neos Co., Ltd.) instead of FTERGENT 251, Charge-Transporting Varnish L was prepared by the same method as in Preparation Example 1.

[Comparative Preparation Example 1] Charge-Transporting Varnish M

Aside from not using FTERGENT 251, Charge-Transporting Varnish M was prepared by the same method as in Preparation Example 1.

[Preparation Example 13] Charge-Transporting Varnish N

Aside from using FTERGENT 710FL (Neos Co., Ltd.) instead of FTERGENT 251, Charge-Transporting Varnish N was prepared by the same method as in Preparation Example 1.

[Preparation Example 14] Charge-Transporting Varnish O

Aside from using 0.04 g of FTERGENT 710FL (Neos Co., Ltd.) instead of FTERGENT 251, Charge-Transporting Varnish O was prepared by the same method as in Preparation Example 1.

[Preparation Example 15] Charge-Transporting Varnish P

Aside from using FTERGENT 710FM (Neos Co., Ltd.) instead of FTERGENT 251, Charge-Transporting Varnish P was prepared by the same method as in Preparation Example 1.

[Preparation Example 16] Charge-Transporting Varnish Q

Aside from using 0.04 g of FTERGENT 710FM (Neos Co., Ltd.) instead of Fterg FTERGENT ent 251, Charge-Transporting Varnish Q was prepared by the same method as in Preparation Example 1.

[Preparation Example 17] Charge-Transporting Varnish R

Aside from using FTERGENT 710FS (Neos Co., Ltd.) instead of FTERGENT 251, Charge-Transporting Varnish R was prepared by the same method as in Preparation Example 1.

[Preparation Example 18] Charge-Transporting Varnish S

Aside from using 0.04 g of FTERGENT 710FS (Neos Co., Ltd.) instead of FTERGENT 251, Charge-Transporting Varnish S was prepared by the same method as in Preparation Example 1.

[2] Evaluation of Flatness within Pixels

Working Example 1-1, Comparative Example 1-1

Charge-Transporting Varnishes A to M were spin-coated onto ITO substrates having structures with a pixel width (spacing between structures) of 50×100 μm created using a positive-working photosensitive polyimide, and the resulting films were dried for 1 minute at 80° C. and baked for 15 minutes under applied heat at 230° C. in open air on a hot plate, thereby producing thin films having a thickness of 30 nm. The maximum step height on the film in the pixel portion was measured with a contact-type film thickness meter. The results are shown in Table 1.

TABLE 1

| | Charge-transporting varnishes | | | | | | | | | | | |
|---|---|---|---|---|---|---|---|---|---|---|---|---|
| | A | B | C | D | E | F | G | H | I | J | K | L | M |
| Maximum step height (nm) | 2.6 | 1.5 | 1.9 | 1.9 | 1.3 | 1.7 | 2.7 | 0.8 | 2.1 | 1.9 | 1.3 | 1.1 | 17.4 |

As shown in Table 1, in Charge-Transporting Varnish M to which a nonionic fluorine-containing surfactant was not added, the maximum step height was 17.4 nm, whereas in Charge-Transporting Varnishes A to L to which a nonionic fluorine-containing surfactant was added, the maximum step height was less than 3 nm, demonstrating a great improvement in flatness within pixels.

Working Example 1-2

Charge-Transporting Varnishes N to S were spin-coated onto ITO substrates having structures with a pixel width (spacing between structures) of 50×100 μm created using a positive-working photosensitive polyimide, and the resulting films were dried for 1 minute at 80° C. and baked for 15 minutes under applied heat at 230° C. on a hot plate in open air, thereby producing thin films having a thickness of 30 nm, 60 nm and 100 nm. The maximum step height on the film in the pixel portion was measured with a contact-type film thickness meter. The results are shown in Table 2.

TABLE 2

| Film thickness | Charge-transporting varnishes | | | | | |
|---|---|---|---|---|---|---|
| | | N | O | P | Q | R | S |
| Maximum step height (nm) | 30 nm | 1.6 | 1.5 | 1.8 | 1.9 | 2.5 | 1.9 |
| | 60 nm | 1.6 | 1.4 | 1.8 | 2.0 | 2.7 | 2.0 |
| | 100 nm | 1.8 | 1.5 | 2.0 | 2.1 | 2.8 | 2.2 |

As shown in Table 2, in Charge-Transporting Varnishes N to S to which a nonionic fluorine-containing surfactant was added, the maximum step at film thicknesses of 30 to 100 nm was less than 3 nm, demonstrating that the flatness within the pixel is greatly improved.

[3] Evaluation of Contact Angle

Working Example 2-1, Comparative Example 2-1

Charge-Transporting Varnishes A to M were spin-coated onto substrates having a blanket film of ITO deposited thereon, and the resulting films were dried for 1 minute at 80° C. and baked for 15 minutes under applied heat at 230° C. on a hot plate in open air, thereby forming thin films having a thickness of 30 nm. The contact angles of cyclohexylbenzene (CHB) and 3-phenoxytoluene (3PT) on the resulting thin films were measured. The results are shown in Table 3.

TABLE 3

| | Charge-transporting varnishes | | | | | | | | | | | | |
|---|---|---|---|---|---|---|---|---|---|---|---|---|---|
| | A | B | C | D | E | F | G | H | I | J | K | L | M |
| CHB contact angle (°) | 5.3 | 2.4 | 2.8 | 2.3 | 2.5 | 2.7 | 2.2 | 2.4 | 2.3 | 2.0 | 4.9 | 2.1 | 1.6 |
| 3PT contact angle (°) | 6.4 | 4.8 | 4.5 | 4.7 | 4.6 | 6.3 | 4.6 | 4.6 | 5.0 | 4.9 | 6.6 | 4.3 | 4.3 |

As shown in Table 3, the contact angles on the thin films produced from Charge-Transporting Varnishes A to L to which a nonionic fluorine-containing surfactant was added were unchanged from the contact angle on a thin film produced from Charge-Transporting Varnish M to which a nonionic fluorine-containing surfactant was not added, demonstrating that the added surfactant does not have an adverse influence on the wettability of the top layer.

[Working Example 2-2] Evaluation of Contact Angle

Charge-Transporting Varnishes N to S were spin-coated onto substrates having a blanket film of ITO deposited thereon, and the resulting films were dried for 1 minute at 80° C. and baked for 15 minutes under applied heat at 230° C. on a hot plate in open air, thereby forming thin films having thicknesses of 30 nm, 60 nm and 100 nm. The contact angles of cyclohexylbenzene (CHB) on the resulting thin films were measured. The results are shown in Table 4.

TABLE 4

| Film thickness | Charge-transporting varnishes | | | | | |
|---|---|---|---|---|---|---|
| | | N | O | P | Q | R | S |
| CHB contact angle (° C.) | 30 nm | 2.0 | 2.0 | 1.8 | 1.5 | 2.0 | 2.4 |
| | 60 nm | 2.7 | 4.1 | 2.0 | 2.5 | 2.3 | 3.3 |
| | 100 nm | 3.3 | 4.1 | 2.3 | 4.2 | 2.3 | 2.6 |

As shown in Table 4, the contact angles on thin films produced from Charge-Transporting Varnishes N to S to which a nonionic fluorine-containing surfactant was added were all less than 5° at film thicknesses of 30 to 100 nm, demonstrating that the added surfactant does not have an adverse influence on the wettability of the top layer during coating.

[4] Production of Organic EL Devices (OLED Devices) and Evaluation of Device Characteristics A glass substrate with dimensions of 25 mm×25 mm×0.7 mm (t) and having indium-tin oxide patterned on the surface to a film thickness of 150 nm (referred to below as an "ITO substrate") was used as the substrate for evaluating the electrical characteristics. The ITO substrate was used after removing impurities from the surface using an $O_2$ plasma cleaning system (150 W, 30 seconds).

[Working Example 3-1] Production of OLED Devices Using Charge-Transporting Varnish A Charge-Transporting Varnish A obtained in Working Example 1 was coated onto an ITO substrate using a spin coater, then dried at 80° C. for 1 minute and subsequently baked at 230° C. for 15 minutes, thereby forming a 35 nm uniform thin film on the ITO substrate.

Next, using a vapor deposition system (degree of vacuum, $1.0 \times 10^{-5}$ Pa), thin films of N,N'-di(1-naphthyl)-N,N'-diphenylbenzidine (α-NPD), tris(-quinolinolato)aluminum(III) ($Alq_3$), lithium fluoride and aluminum were successively deposited onto the ITO substrate on which a thin film had been formed, thereby giving an OLED device. At this time, vapor deposition was carried out at a rate of 0.2 nm/s for $Alq_3$ and aluminum, and at a rate of 0.02 nm/s for lithium fluoride. The film thicknesses were set to, respectively, 30 nm, 40 nm, 0.5 nm and 100 nm.

To prevent the device characteristics from deteriorating due to the influence of oxygen, moisture and the like in air, the OLED device was sealed with sealing substrates, following which the characteristics were evaluated. Sealing was carried out by the following procedure.

In a nitrogen atmosphere having an oxygen concentration of not more than 2 ppm and a dew point of not more than −85° C., the organic EL device was placed between sealing substrates and the sealing substrates were laminated together using an adhesive (XNR5516Z-B1, from Nagase ChemteX Corporation). At this time, a desiccant (HD-071010W-40, from Dynic Corporation) was placed, together with the OLED device, within the sealing substrates.

The laminated sealing substrates were irradiated with UV light (wavelength, 365 nm; dosage, 6,000 mJ/cm$^2$), and then annealed at 80° C. for 1 hour to cure the adhesive.

[Working Example 3-2] Production of OLED Device Using Charge-Transporting Varnish B Aside from using Charge-Transporting Varnish B obtained in Preparation Example 2 instead of Charge-Transporting Varnish A, an OLED was produced in the same way as in Working Example 3-1.

[Working Example 3-3] Production of OLED Device Using Charge-Transporting Varnish C Aside from using Charge-Transporting Varnish C obtained in Preparation Example 3 instead of Charge-Transporting Varnish A, an OLED device was produced in the same way as in Working Example 3-1.

[Working Example 3-4] Production of OLED Device Using Charge-Transporting Varnish D Aside from using Charge-Transporting Varnish D obtained in Preparation Example 4 instead of Charge-Transporting Varnish A, an OLED device was produced in the same way as in Working Example 3-1.

[Working Example 3-5] Production of OLED Device Using Charge-Transporting Varnish E Aside from using Charge-Transporting Varnish E obtained in Preparation Example 5 instead of Charge-Transporting Varnish A, an OLED device was produced in the same way as in Working Example 3-1.

[Working Example 3-6] Production of OLED Device Using Charge-Transporting Varnish F Aside from using Charge-Transporting Varnish F obtained in Preparation Example 6 instead of Charge-Transporting Varnish A, an OLED device was produced in the same way as in Working Example 3-1.

[Working Example 3-7] Production of OLED Device Using Charge-Transporting Varnish G Aside from using Charge-Transporting Varnish G obtained in Preparation Example 7 instead of Charge-Transporting Varnish A, an OLED device was produced in the same way as in Working Example 3-1.

[Working Example 3-8] Production of OLED Device Using Charge-Transporting Varnish H Aside from using Charge-Transporting Varnish H obtained in Preparation Example 8 instead of Charge-Transporting Varnish A, an OLED device was produced in the same way as in Working Example 3-1.

[Working Example 3-9] Production of OLED Device Using Charge-Transporting Varnish I Aside from using Charge-Transporting Varnish I obtained in Preparation Example 9 instead of Charge-Transporting Varnish A, an OLED device was produced in the same way as in Working Example 3-1.

[Working Example 3-10] Production of OLED Device Using Charge-Transporting Varnish J Aside from using Charge-Transporting Varnish J obtained in Preparation Example 10 instead of Charge-Transporting Varnish A, an OLED device was produced in the same way as in Working Example 3-1.

[Working Example 3-11] Production of OLED Device Using Charge-Transporting Varnish K Aside from using Charge-Transporting Varnish K obtained in Preparation Example 11 instead of Charge-Transporting Varnish A, an OLED device was produced in the same way as in Working Example 3-1.

[Working Example 3-12] Production of OLED Device Using Charge-Transporting Varnish L Aside from using Charge-Transporting Varnish L obtained in Preparation Example 12 instead of Charge-Transporting Varnish A, an OLED device was produced in the same way as in Working Example 3-1.

[Working Example 3-13] Production of OLED Device Using Charge-Transporting Varnish N Aside from using Charge-Transporting Varnish N obtained in Preparation Example 13 instead of Charge-Transporting Varnish A, an OLED device was produced in the same way as in Working Example 3-1.

[Working Example 3-14] Production of OLED Device Using Charge-Transporting Varnish O Aside from using Charge-Transporting Varnish O obtained in Preparation Example 14 instead of Charge-Transporting Varnish A, an OLED device was produced in the same way as in Working Example 3-1.

[Working Example 3-15] Production of OLED Device Using Charge-Transporting Varnish P Aside from using Charge-Transporting Varnish P obtained in Preparation Example 15 instead of Charge-Transporting Varnish A, an OLED device was produced in the same way as in Working Example 3-1.

[Working Example 3-16] Production of OLED Device Using Charge-Transporting Varnish Q Aside from using Charge-Transporting Varnish Q obtained in Preparation Example 16 instead of Charge-Transporting Varnish A, an OLED device was produced in the same way as in Working Example 3-1.

[Working Example 3-17] Production of OLED Device Using Charge-Transporting Varnish R Aside from using Charge-Transporting Varnish R obtained in Preparation Example 17 instead of Charge-Transporting Varnish A, an OLED device was produced in the same way as in Working Example 3-1.

[Working Example 3-18] Production of OLED Device Using Charge-Transporting Varnish S Aside from using Charge-Transporting Varnish S obtained in Preparation Example 18 instead of Charge- Transporting Varnish A, an OLED device was produced in the same way as in Working Example 3-1.

[Comparative Example 3-1] Production of OLED Device Using Charge-Transporting Varnish M Aside from using Charge-Transporting Varnish M obtained in Comparative Preparation Example 1 instead of Charge-Transporting Varnish A, an OLED device was produced in the same way as in Working Example 3-1.

The voltage, current density and current efficiency at a brightness of 5,000 cd/m², as well as the brightness half-life (initial brightness, 5,000 cd/m²), of the OLED devices obtained in Working Examples 3-1 to 3-18 and Comparative Example 3-1 were measured. The results are shown in Table 5.

TABLE 5

| | Voltage (V) | Current density (mA/cm²) | Current efficiency (cd/A) | Brightness half-life (h) |
|---|---|---|---|---|
| Working Example 3-1 | 5.3 | 167 | 3.0 | 373 |
| Working Example 3-2 | 5.3 | 161 | 3.1 | 395 |
| Working Example 3-3 | 5.3 | 169 | 2.9 | 335 |
| Working Example 3-4 | 5.3 | 162 | 3.1 | 344 |
| Working Example 3-5 | 5.4 | 183 | 2.7 | 323 |
| Working Example 3-6 | 5.3 | 163 | 3.1 | 393 |
| Working Example 3-7 | 5.3 | 165 | 3.0 | 352 |
| Working Example 3-8 | 5.3 | 163 | 3.0 | 333 |
| Working Example 3-9 | 5.3 | 165 | 3.0 | 359 |
| Working Example 3-10 | 5.4 | 166 | 3.0 | 274 |
| Working Example 3-11 | 5.3 | 164 | 3.0 | 351 |
| Working Example 3-12 | 5.3 | 168 | 3.0 | 327 |
| Working Example 3-13 | 5.3 | 159 | 3.1 | 351 |
| Working Example 3-14 | 5.4 | 154 | 3.2 | 364 |
| Working Example 3-15 | 5.3 | 159 | 3.1 | 344 |
| Working Example 3-16 | 5.3 | 158 | 3.1 | 350 |
| Working Example 3-17 | 5.3 | 158 | 3.1 | 343 |
| Working Example 3-18 | 5.3 | 161 | 3.1 | 338 |
| Comparative Example 3-1 | 5.3 | 167 | 3.0 | 345 |

As shown in Table 5, the devices in Working Examples 3-1 to 3-18 in which a nonionic fluorine-containing surfactant was added to the varnish did not differ much in initial characteristics and brightness half-life compared with the device in Comparative Example 3-1 in which such a surfactant was not added. It is thus apparent that the nonionic fluorine-containing surfactant that was added did not affect the device characteristics.

The invention claimed is:

1. A charge-transporting varnish consisting essentially of a charge-transporting substance, a nonionic fluorine-containing surfactant, an organic solvent and a dopant substance, wherein the nonionic fluorine-containing surfactant has a perfluoroalkenyl group-containing perfluorohydrocarbon structure and an alkylene oxide structure,
   the dopant substance is at least one selected from the group consisting of a heteropolyacid and an arylsulfonic acid compound having a molecular weight being not more than 2,000,
   the charge-transporting substance is a charge-transporting monomer, or charge-transporting oligomer having a molecular weight of from 200 to 5,000, and
   the charge-transporting oligomer is an aniline derivative.

2. The charge-transporting varnish of claim 1, wherein the perfluoroalkenyl group is a branched-chain perfluoroalkenyl group.

3. The charge-transporting varnish of claim 1 or 2, wherein the perfluoroalkenyl group-containing perfluorohydrocarbon structure is represented by any one of formulas (1) to (3):

[Chemical Formula 1]

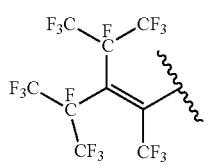

(1)

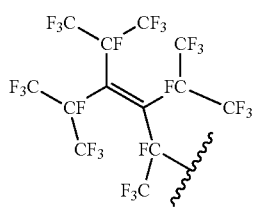

(2)

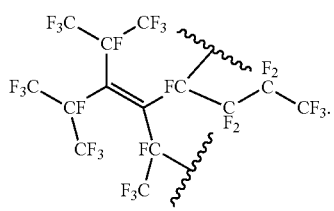

(3)

4. The charge-transporting varnish of claim 1, wherein the alkylene oxide structure includes a group of the formula $-(A^0O)_n-$ (wherein $A^0$ is an alkylene group of 2 to 10 carbon atoms, and n is an integer from 2 to 50).

5. The charge-transporting varnish of claim 4, wherein the alkylene oxide structure has the formula $-(CH_2CH_2O)_n-$ (wherein n is as defined above).

6. The charge-transporting varnish of claim 1, wherein the arylsulfonic acid compound is represented by formula (5) or (6),

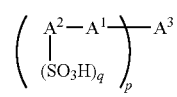

(5)

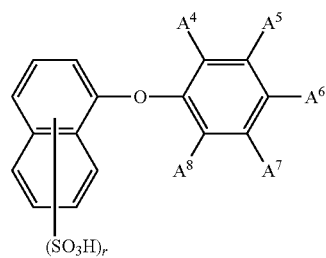

(6)

wherein, $A^1$ is oxygen or sulfur,
   $A^2$ is a naphthalene ring or an anthracene ring,
   $A^3$ is a perfluorobiphenyl group having a valence of 2 to 4,
   the letter p represents the number of bonds between $A^1$ and $A^3$, this being an integer which satisfies the condition $2 \leq p \leq 4$, the letter q represents the number of sulfonic acid groups that bond with $A^2$, this being an integer that satisfies the condition $1 \leq q \leq 4$, $A^4$ to $A^8$ are each independently a hydrogen atom, a halogen atom, a cyano group, an alkyl group of 1 to 20 carbon atoms, a halogenated alkyl group of 1 to 20 carbon atoms or a halogenated alkenyl group of 2 to 20 carbon atoms, with at least three from among $A^4$ to $A^8$ being halogen atoms, and the letter r represents the number of sulfonic acid groups bonded to the naphthalene ring, this being an integer which satisfies the condition $1 \leq r \leq 4$.

7. A charge-transporting thin film produced using the charge-transporting varnish of claim 1.

8. An electronic device comprising the charge-transporting thin film of claim 7.

9. An organic electroluminescent device comprising the charge-transporting thin film of claim 7.

10. The organic electroluminescent device of claim 9, wherein the charge-transporting thin film is a hole injection layer.

11. A method for producing a charge-transporting thin-film, the method being characterized by the steps of applying the charge-transporting varnish of claim 1 onto a substrate, and evaporating off the solvent.

\* \* \* \* \*